US00RE46901E

(19) United States
(12) Reissued Patent
Matsuoka et al.

(10) Patent Number: US RE46,901 E
(45) Date of Reissued Patent: Jun. 19, 2018

(54) DROP RECIPE CREATING METHOD, DATABASE CREATING METHOD AND MEDIUM

(71) Applicant: Toshiba Memory Corporation, Tokyo (JP)

(72) Inventors: Yasuo Matsuoka, Kanagawa (JP); Takumi Ota, Kanagawa (JP); Ryoichi Inanami, Kanagawa (JP)

(73) Assignee: Toshiba Memory Corporation, Tokyo (JP)

(21) Appl. No.: 14/883,569

(22) Filed: Oct. 14, 2015

Related U.S. Patent Documents

Reissue of:
(64) Patent No.: 8,560,977
Issued: Oct. 15, 2013
Appl. No.: 13/238,615
Filed: Sep. 21, 2011

(30) Foreign Application Priority Data

Nov. 22, 2010 (JP) ..... 2010-260293

(51) Int. Cl.
*G06F 17/50* (2006.01)
*G03F 7/00* (2006.01)
*B82Y 10/00* (2011.01)

(52) U.S. Cl.
CPC ..... *G03F 7/0002* (2013.01); *B82Y 10/00* (2013.01)

(58) Field of Classification Search
CPC ..... B82Y 10/00; G03F 7/0002
USPC ..... 716/30, 54, 55
See application file for complete search history.

(56) References Cited

U.S. PATENT DOCUMENTS 3,689,747 A * 9/1972 Di Milia et al. ..... 700/266
5,580,500 A * 12/1996 Muramatsu et al. ..... 264/29.1
6,122,564 A * 9/2000 Koch et al. ..... 700/123
6,415,193 B1 * 7/2002 Betawar ..... G05B 19/41865 700/121
6,560,751 B1 * 5/2003 Rose ..... 716/107
(Continued)

FOREIGN PATENT DOCUMENTS

JP 2007-296783 11/2007
JP 2007-296783 A 11/2007
(Continued)

OTHER PUBLICATIONS

Morinaga, H. et al., "Method for Forming Pattern and a Semiconductor Device," U.S. Appl. No. 13/040,294, filed Mar. 4, 2011.

*Primary Examiner* — Fred Ferris, III
(74) *Attorney, Agent, or Firm* — Finnegan, Henderson, Farabow, Garrett & Dunner, L.L.P.

(57) ABSTRACT

According to one embodiment, a plurality of test drop recipes are first created based on design data on a semiconductor integrated circuit. Based on a defect inspection result of a pattern of a hardening resin material, which is formed by pressing a template on which patterns of the semiconductor integrated circuit are formed onto the hardening resin material applied to a substrate to be processed by use of the test drop recipes, a drop recipe with least defects is selected per press position on the substrate to be processed from the test drop recipes. The selected drop recipes for respective press positions are collected per functional circuit block configuring the semiconductor integrated circuit, thereby to generate a drop recipe creation assistant database.

35 Claims, 8 Drawing Sheets

(56) References Cited

U.S. PATENT DOCUMENTS 6,580,959 B1 * 6/2003 Mazumder ..... 700/121
6,775,818 B2 * 8/2004 Taravade et al. ..... 716/53
6,909,993 B2 * 6/2005 Nakao et al. ..... 702/185
6,937,963 B2 * 8/2005 Ishii et al. ..... 702/185
7,024,655 B2 * 4/2006 Cobb ..... 716/52
7,159,205 B1 * 1/2007 Amblard ..... B82Y 10/00 716/54
7,334,202 B1 * 2/2008 Singh et al. ..... 716/132
7,409,327 B2 * 8/2008 Deliwala ..... 703/14
7,648,767 B2 * 1/2010 Fu ..... B82Y 10/00 428/429
7,856,288 B2 * 12/2010 Yoneda et al. ..... 700/206
7,939,003 B2 * 5/2011 Bonassar et al. ..... 264/308
8,132,130 B2 * 3/2012 Chen et al. ..... 716/54
8,191,021 B2 * 5/2012 Rezgui ..... 716/106
8,245,161 B1 * 8/2012 Tortonese et al. ..... 716/51
8,293,354 B2 * 10/2012 Fu ..... B82Y 10/00 428/141
8,343,371 B2 * 1/2013 Funk et al. ..... 216/59
8,392,855 B2 * 3/2013 Morinaga ..... G03F 7/0002 430/5
8,691,389 B2 * 4/2014 Fu ..... B82Y 10/00 264/293
8,888,920 B2 * 11/2014 Terada ..... B08B 3/024 101/483
9,046,763 B2 * 6/2015 Koshiba ..... B82Y 10/00
2003/0196186 A1 * 10/2003 Scholl ..... G06Q 10/06 717/100
2004/0040000 A1 * 2/2004 Taravade et al. ..... 716/4
2005/0026455 A1 * 2/2005 Hamada et al. ..... 438/782
2007/0252205 A1 * 11/2007 Hoentschel ..... H01L 21/84 257/347
2008/0021587 A1 * 1/2008 Wu et al. ..... 700/121
2008/0050659 A1 * 2/2008 Ohtake et al. ..... 430/5
2008/0090170 A1 4/2008 Yoneda
2008/0160649 A1 * 7/2008 Fujii et al. ..... 438/7
2008/0201126 A1 * 8/2008 Won et al. ..... 703/14
2008/0214010 A1 9/2008 Yoneda et al.
2008/0276128 A1 * 11/2008 Lin ..... G05B 19/0428 714/45
2009/0104783 A1 * 4/2009 Jin et al. ..... 438/745
2009/0125126 A1 * 5/2009 Moore, Jr. ..... G05B 19/41865 700/29
2009/0125906 A1 * 5/2009 Moore, Jr. ..... G05B 19/41865 718/101
2009/0164933 A1 * 6/2009 Pederson ..... G05B 19/409 715/772
2010/0025814 A1 * 2/2010 Kemerer et al. ..... 257/532
2010/0029084 A1 * 2/2010 Koshiba et al. ..... 438/701
2010/0154826 A1 * 6/2010 Printz ..... 134/18
2010/0187714 A1 * 7/2010 Kobiki et al. ..... 264/135
2011/0182805 A1 * 7/2011 DeSimone et al. ..... 424/1.11
2011/0209106 A1 * 8/2011 Cheng et al. ..... 716/55
2011/0229988 A1 * 9/2011 Asano et al. ..... 438/7
2011/0247934 A1 * 10/2011 Wang et al. ..... 204/450
2012/0032377 A1 * 2/2012 Montelius et al. ..... 264/408
2012/0072003 A1 * 3/2012 Matsuoka et al. ..... 700/110
2012/0117520 A1 * 5/2012 Kitamura et al. ..... 716/53
2012/0129279 A1 * 5/2012 Matsuoka et al. ..... 438/16
2012/0208327 A1 * 8/2012 Matsuoka ..... 438/127
2013/0069162 A1 * 3/2013 Lin ..... H01L 27/0207 257/368
2013/0111419 A1 * 5/2013 Lin ..... H01L 21/26586 716/53

FOREIGN PATENT DOCUMENTS

JP 2007-320098 12/2007
JP 2007-320098 A 12/2007

* cited by examiner

DROP RECIPE CREATING METHOD, DATABASE CREATING METHOD AND MEDIUM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This [application] *is a reissue of U.S. Pat. No. 8,560,977, issued on Oct. 15, 2013, from U.S. patent application Ser. No. 13/238,615, which* is based upon and claims the benefit of priority from the prior Japanese Patent Application No. 2010-260293, filed on Nov. 22, 2010[; the]. *The* entire contents of [which] *the above-identified applications* are incorporated herein by reference.

FIELD

Embodiments described herein relate generally to a drop recipe creating method, a database creating method and a medium.

BACKGROUND

A nanoimprint lithography technique (which will be simply referred to as nanoimprinting below) is known as a semiconductor integrated circuit manufacturing technique. The nanoimprinting is a technique for pressing a template on which a pattern of a semiconductor integrated circuit is formed onto a resist applied on a semiconductor wafer, and thereby transferring the pattern formed on the template onto the resist. The application amount of a resist material is controlled based on a drop recipe defining an application amount distribution of the resist material onto the wafer.

DETAILED DESCRIPTION

In general, according to one embodiment, a plurality of test drop recipes are first created based on design data on a semiconductor integrated circuit. Based on a defect inspection result of a pattern of a hardening resin material, which is formed by pressing a template on which patterns of the semiconductor integrated circuit are formed onto the hardening resin material applied to a substrate to be processed by use of the test drop recipes, a drop recipe with least defects is selected per press position on the substrate to be processed from the test drop recipes. The selected drop recipes for respective press positions are collected per functional circuit block configuring the semiconductor integrated circuit, thereby to generate a drop recipe creation assistant database.

Exemplary embodiments of a drop recipe creating method, a database creating method and a medium will be explained below in detail with reference to the accompanying drawings. The present invention is not limited to the following embodiments.

A drop recipe creating method, a database creating method and a recording medium according to the embodiments will be described below in detail with reference to the accompanying drawings. The present invention is not limited to the embodiments.

Figure 1A:
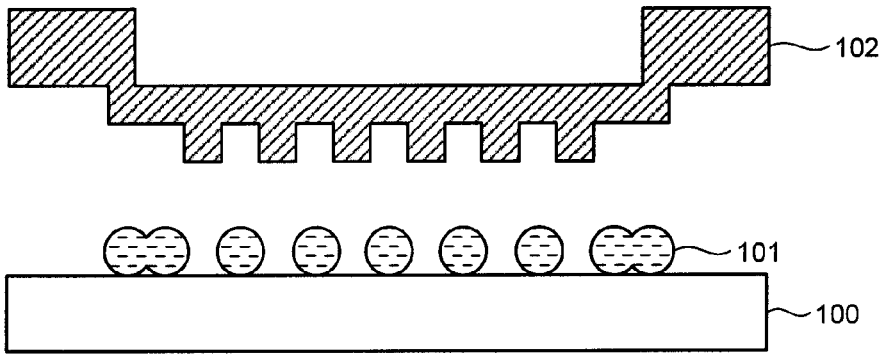
FIG. 1A is a diagram for explaining a transferring step by nanoimprinting.
Figure 1B:
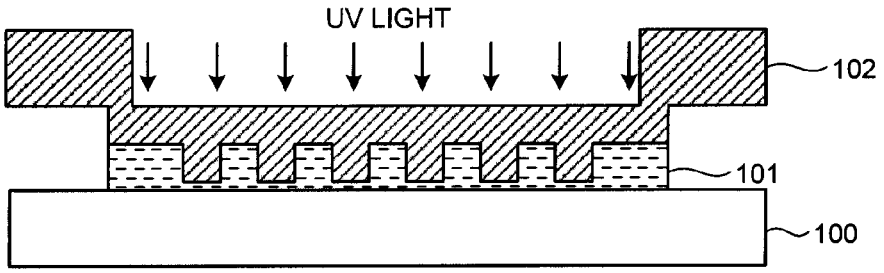
FIG. 1B is a diagram for explaining the transferring step by the nanoimprinting.
Figure 1C:
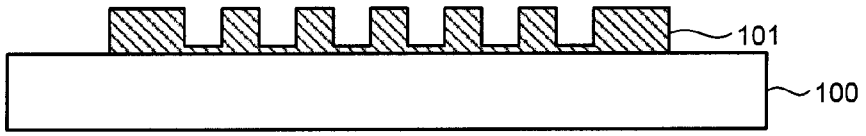
FIG. 1C is a diagram for explaining the transferring step by the nanoimprinting.

A typical transferring step by nanoimprinting will be first described. FIGS. 1A to 1C are diagrams for explaining the transferring step by nanoimprinting. Optical nanoimprinting for hardening a resist (optical hardening resin material) by ultraviolet light irradiation will be described herein by way of example, but the embodiments are applicable to thermal nanoimprinting for hardening a resist (thermal hardening resin material) by heating.

In the transferring step, as illustrated in FIG. 1A, a resist material 101 (exemplary hardening resin material) is first applied on a wafer 100 to be processed (exemplary substrate to be processed). An imprinting apparatus has a nozzle which is two-dimensionally driven in parallel to the wafer 100 and is directed for discharging the resist material 101, and can locally change the application amount of the resist material 101 based on a drop recipe defining an application amount distribution of the resist material. The drop recipe is created based on design data on a design pattern (or resist pattern or template pattern may be possible). The drop recipe is defined such that the application amount is large at a resist pattern with high density and the application amount is small at a resist pattern with low density. The application amount distribution in the drop recipe is defined by the amount of one drop of resist material (the discharge amount) discharged from the nozzle and a discharge position per droplet, for example. In FIG. 1A, with the imprinting apparatus of this type, the droplets of the resist material 101 drop on concave parts of a template 102.

Subsequently, the template 102 is pressed onto the wafer 100 on which the resist material 101 is applied. The resist material 101 enters the concave parts of the template pattern formed on the template 102 due to a capillary action. After the resist material 101 fully enters the template pattern, an ultraviolet light is irradiated from above the template 102 as illustrated in FIG. 1B. The template 102 is made of a material such as quartz capable of transmitting an ultraviolet light (UV light), and the UV light irradiated from above the template 102 transmits the template 102 to be irradiated onto the resist material 101. The resist material 101 is hardened by the UV light irradiation.

After the resist material 101 is hardened, the template 102 is separated therefrom and the resist pattern is formed by the hardened resist material 101 on the wafer 100 as illustrated in FIG. 1C.

The resist material 101 formed on the wafer 100 is polished by chemical mechanical polishing in a later step. In the chemical mechanical polishing, a different force is applied between the resist pattern at the outermost of the wafer 100 and the resist pattern at the center of the wafer 100, and thus the resist pattern formed on the wafer 100 cannot be planarized well. Thus, it is ideal that the entire wafer 100 is covered with a uniform pattern.

Figure 2:
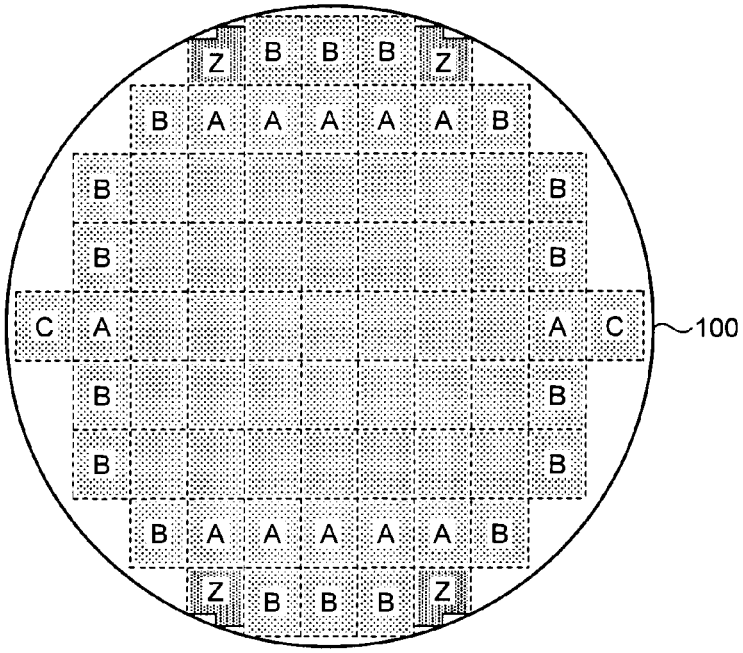
FIG. 2 is an overhead view of one wafer 100.

FIG. 2 is an overhead view of one wafer 100. Each of the rectangles illustrated in FIG. 2 is an area in which the resist pattern is formed by one imprinting (which will be referred to as one-shot area below). As illustrated, the wafer 100 is imprinted at shifted imprint positions multiple times so that the resist pattern is formed on substantially the entire wafer 100. The imprint position Z is out of the periphery of the wafer 100, which is further outside the outermost one-shot area, and one-shot imprinting cannot be performed on the imprint position Z, but the imprinting is performed thereon.

When the same drop recipe is used to perform imprinting on the outermost and the center of the wafer 100, the resist material spreads out of the outer periphery of the wafer 100 when the imprinting is performed on the outermost of the wafer 100. The excess resist material leads to a contamination (particles) in a later step. Thus, when the imprinting is performed on the imprint position at the outermost of the wafer 100, a different drop recipe from that for the center of the wafer 100 needs to be used.

In the example of FIG. 2, although for the imprint position A, four sides of the one-shot area are adjacent to other one-shot areas, even when the same drop recipe is used for a plurality of imprint positions A, the resist material does not excessively spread. In other words, the same resist recipe can be used for the imprint positions A thereby to perform imprinting. However, the same drop recipe as the drop recipe used for the imprint positions A cannot be used for the imprint positions B, the imprint positions C and the imprint positions Z at the outermost. Even at the outermost imprint positions, the same drop recipe cannot be used for the imprint positions B whose one or two sides are not adjacent to other one-shot areas, the imprint positions C whose three sides are not adjacent to other one-shot areas and the imprint positions Z for which a full resist pattern for one shot cannot be imprinted. Therefore, different drop recipes are prepared for the imprint positions A, B, C and Z, respectively.

Figure 3:
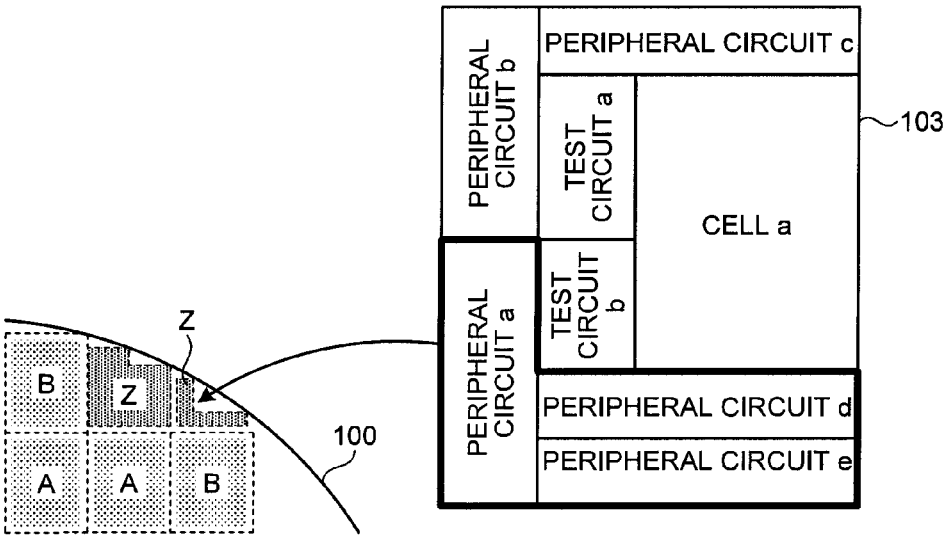
FIG. 3 is a diagram for explaining a pattern to be imprinted onto an imprint position Z.

FIG. 3 is a diagram for explaining a pattern to be imprinted on the imprint position Z. In recent years, there has been employed a designing method for creating design data of an entire semiconductor integrated circuit at a higher speed by previously designing circuit blocks (functional circuit blocks) having a certain function and appropriately combining the design data on the circuit blocks. The previously-designed circuit block is called semiconductor IP (which will be simply referred to as IP below) and is to be dealt with. A chip 103 formed with one-shot illustrated in FIG. 3 is configured in combination of IPs of cell a, test circuit a, test circuit b and peripheral circuits a to e. The peripheral circuits a, d and e in the chip 103 are imprinted on the right imprint position Z out of the imprint positions Z illustrated in FIG. 3.

Figure 4:
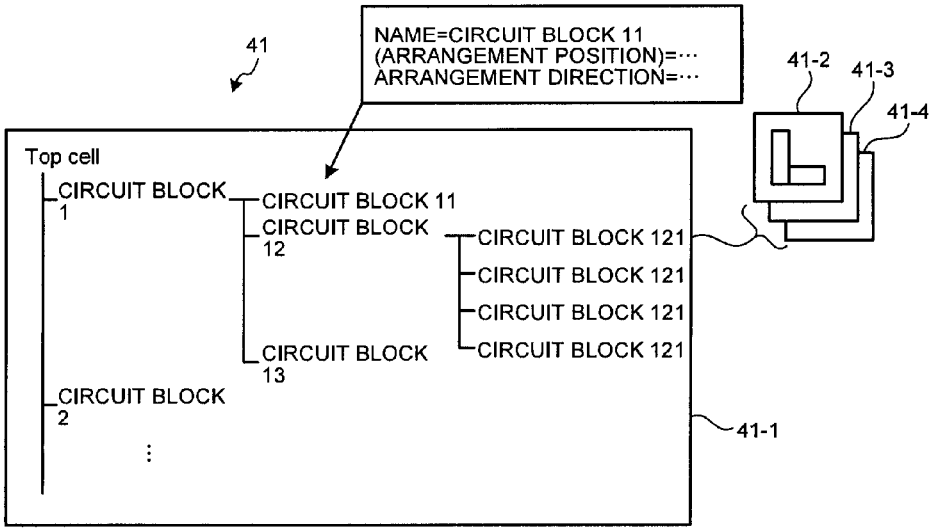
FIG. 4 is a diagram for explaining one exemplary data structure of GDS data.

FIG. 4 is a diagram for explaining one exemplary data structure of GDS data as one example of the design data. GDS data 41 has a plurality of layers, and can hold the design data on different layers configuring a semiconductor integrated circuit such as an insulative oxide film layer and a metal layer in different layers. The GDS data comprises layers in which text is described, and a name, an arrangement position and an arrangement direction per IP are defined (the name, the arrangement position and the arrangement direction are collectively referred to as attribute information below). In the example of FIG. 4, attribute information on two IPs including the circuit block 1 and the circuit block 2 is defined in the layer 41-1.

When the IP is divided into smaller circuit blocks, attribute information on the smaller circuit blocks is further defined in the layer in which the attribute information is defined. For example, when a large circuit block comprises a plurality of identical circuit blocks smaller than the large circuit block, attribute information on the smaller circuit blocks is defined. The items of attribute information on the circuit blocks are associated with each other by way of a hierarchy structure. In the example of FIG. 4, in the layer 41-1, attribute information on the circuit blocks 11, 12 and 13 is defined at a lower tier than the attribute information on the circuit block 1, and attribute information on four circuit blocks 121 is defined at a lower tier than the attribute information on the circuit block 12.

Design data defining a pattern shape is defined for the smallest circuit block. The design data is held in a different layer for the same GDS data. In the example of FIG. 4, the three-layer design data on the circuit blocks 121 is illustrated as held in the layers 41-2, the layer 41-3 and the layer 41-4. Though not illustrated, the circuit block 11 and the circuit block 13 also correspond to the smallest circuit block and the design data on the blocks is held in the GDS data.

Since the GDS data is configured as described above, the total patterns for one template are grasped by arranging all the items of design data on the minimum components based on the attribute information defined in the layer 41-1. In other words, since all the layers including the layers describing therein the design data need to be read for creating the drop recipes, it takes much time to create one drop recipe. In order to obtain an optimum drop recipe per imprint position for manufacturing a semiconductor integrated circuit, multiple test drop recipes need to be created thereby to actually perform imprinting, and a best drop recipe needs to be selected per imprint position from the test drop recipes in terms of the number of defects, and thus there is a problem that a time required to decide drop recipes to be used for actual manufacture increases depending on the number of test drop recipes.

According to the embodiments of the present invention, in order to simplify the work of creating the drip recipes, an optimum drop recipe per imprint position is obtained per IP and the obtained drop recipe is made to a database. When a new semiconductor integrated circuit is manufactured, a drop recipe is extracted from the created database per IP configuring the new semiconductor integrated circuit and is combined based on the attribute information defined in the layer 41-1 so that the drop recipes for the respective imprint positions can be created for the new semiconductor integrated circuit.

Figure 5:
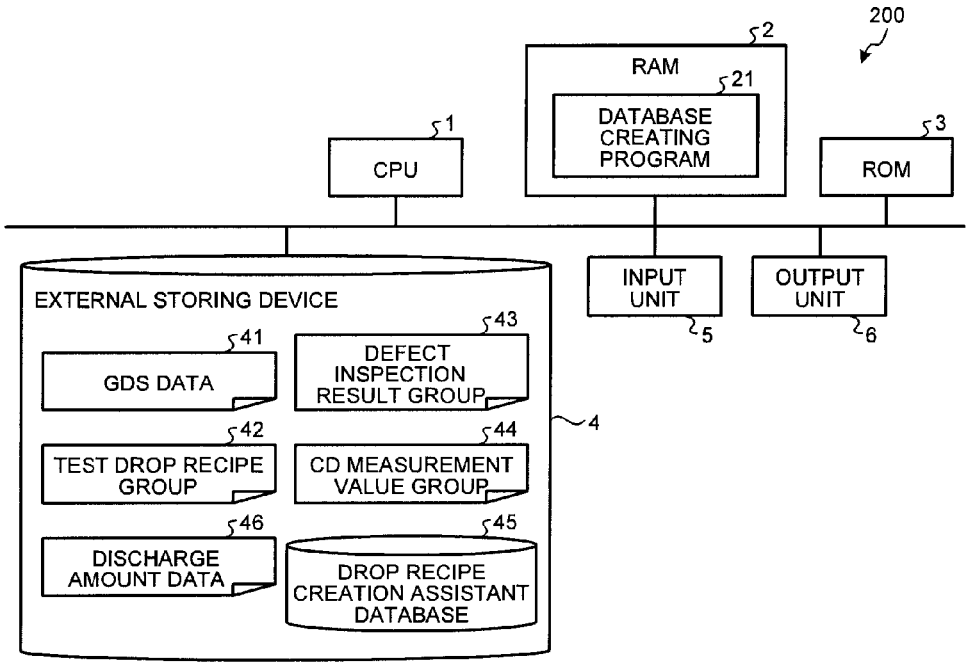
FIG. 5 is a diagram for explaining a structure of a database creating apparatus.

FIG. 5 is a diagram for explaining a structure of a database creating apparatus for creating such a database (drop recipe creation assistant database). As illustrated, a database creating apparatus 200 comprises a CPU 1, RAM (Random Access Memory) 2, ROM (Read Only Memory) 3, an external storing device 4, an input unit 5 and an output unit 6. The CPU 1, the RAM 2, the ROM 3, the external storing device 4, the input unit 5 and the output unit 6 are interconnected via a bus line.

The CPU 1 executes a database creating program 21 as computer program for creating a drop recipe creation assistant database 45. The input unit 5 comprises a mouse and a keyboard, and is input the operations of the database creating apparatus 200 by a user. The operation information input into the input unit 5 is sent to the CPU 1.

The external storing device 4 is configured of a hard disk drive or the like, and is used as a data input/output device of the CPU 1. Specifically, the external storing device 4 previously stores therein the GDS data 41 on a semiconductor integrated circuit to be manufactured. The external storing device 4 stores therein the test drop recipes (test drop recipe group 42) which are created by the CPU 1 changing the discharge amount and the discharge position, respectively.

The test drop recipe group 42 is used by the user for experimentally producing the resist patterns. After the experimental producing, the user inputs defect inspection results (defect inspection result group 43) and CD (Critical Dimension) measurement values (CD measurement value group 44) for the experimentally-produced resist patterns into the external storing device 4. The defect inspection result and the CD measurement value per test drop recipe are input per imprint position.

The CPU 1 refers to the defect inspection result group 43 and the CD measurement value group 44 to select a best drop recipe per imprint position from the test drop recipe group 42 one by one, thereby generating the drop recipe creation assistant database 45 in the external storing device 4.

Figure 6:
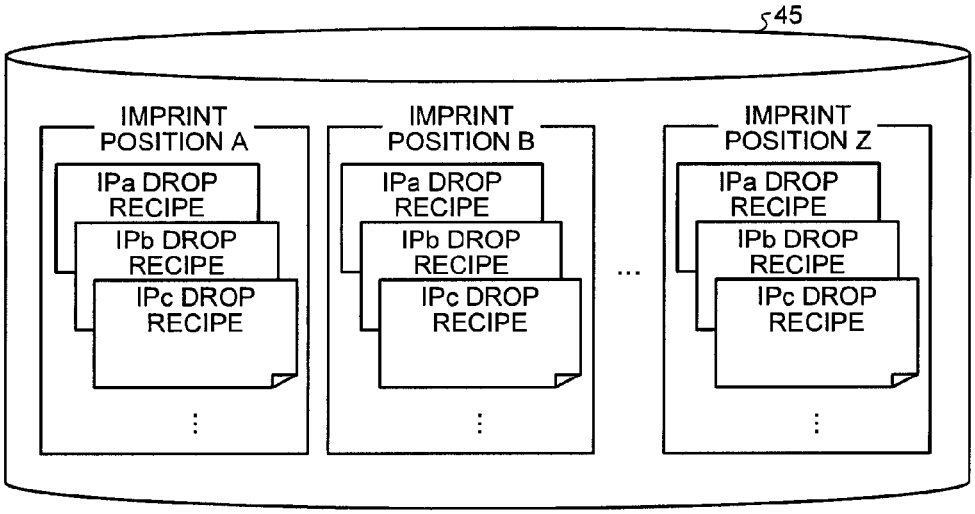
FIG. 6 is a diagram for explaining one exemplary data structure of a drop recipe creation assistant database.

FIG. 6 is a diagram for explaining one exemplary data structure of the drop recipe creation assistant database 45. As illustrated, the drop recipe creation assistant database 45 holds a drop recipe per IP (IPa, IPb, IPc and the like) at each imprint position. Since a unique name per IP and a unique name per imprint position are incorporated in the data or a file name, each drop recipe is associated with the IP and the imprint position so that the IP name and the imprint position can be identified.

A variation in line width occurs in individual templates to be delivered due to a variation in process during template manufacture. In a first embodiment, a representative line width of the used template is associated with the drop recipe per IP. A template manufacturer typically inspects the manufactured templates and delivers them with the inspection result as performance report. The representative line width of the template can be obtained from the attached performance report during the delivery of the templates.

Figure 7:
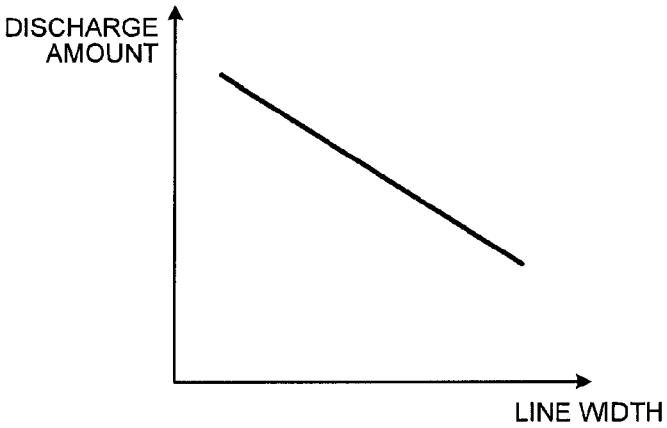
FIG. 7 is a diagram illustrating one exemplary correspondence between a line width and a discharge amount described in discharge amount correction data.

The CPU 1 finds a correspondence between a line width of the template pattern and a discharge amount by which a resist pattern with a desired line width can be obtained from the line width from the test drop recipe group 42, the defect inspection result group 43 and the CD measurement value group 44, and outputs the found correspondence as discharge amount correction data 46 to the external storing device 4. FIG. 7 is a diagram illustrating one exemplary correspondence between the line width and the discharge amount described in the discharge amount correction data 46. As illustrated, the correspondence indicates that as the line width is larger, the discharge amount is smaller.

The user creates drop recipes for one template and adjusts (corrects) the discharge amounts of the created drop recipes based on the discharge amount correction data 46, thereby restricting a variation in a finished shape due to the variation in line width of individual templates for the same design data.

The output unit 6 is a display device such as liquid crystal monitor, and displays output information such as operation screen for an operator based on the instructions from the CPU 1.

The database creating program 21 executed by the database creating apparatus 200 may be stored on a computer connected to a network such as the Internet and may be downloaded via the network to be provided or distributed. The database creating program 21 may be provided or distributed via the network such as the Internet. The database creating program 21 may be previously incorporated in the ROM 3 or the external storing device 4 to be provided to the database creating apparatus 200. The database creating program 21 may be recorded in a recording medium such as a CD-ROM to be provided or distributed.

A database creating method for creating the drop recipe creation assistant database 45 by use of the database creating apparatus 200 will be described below.

Figure 8:
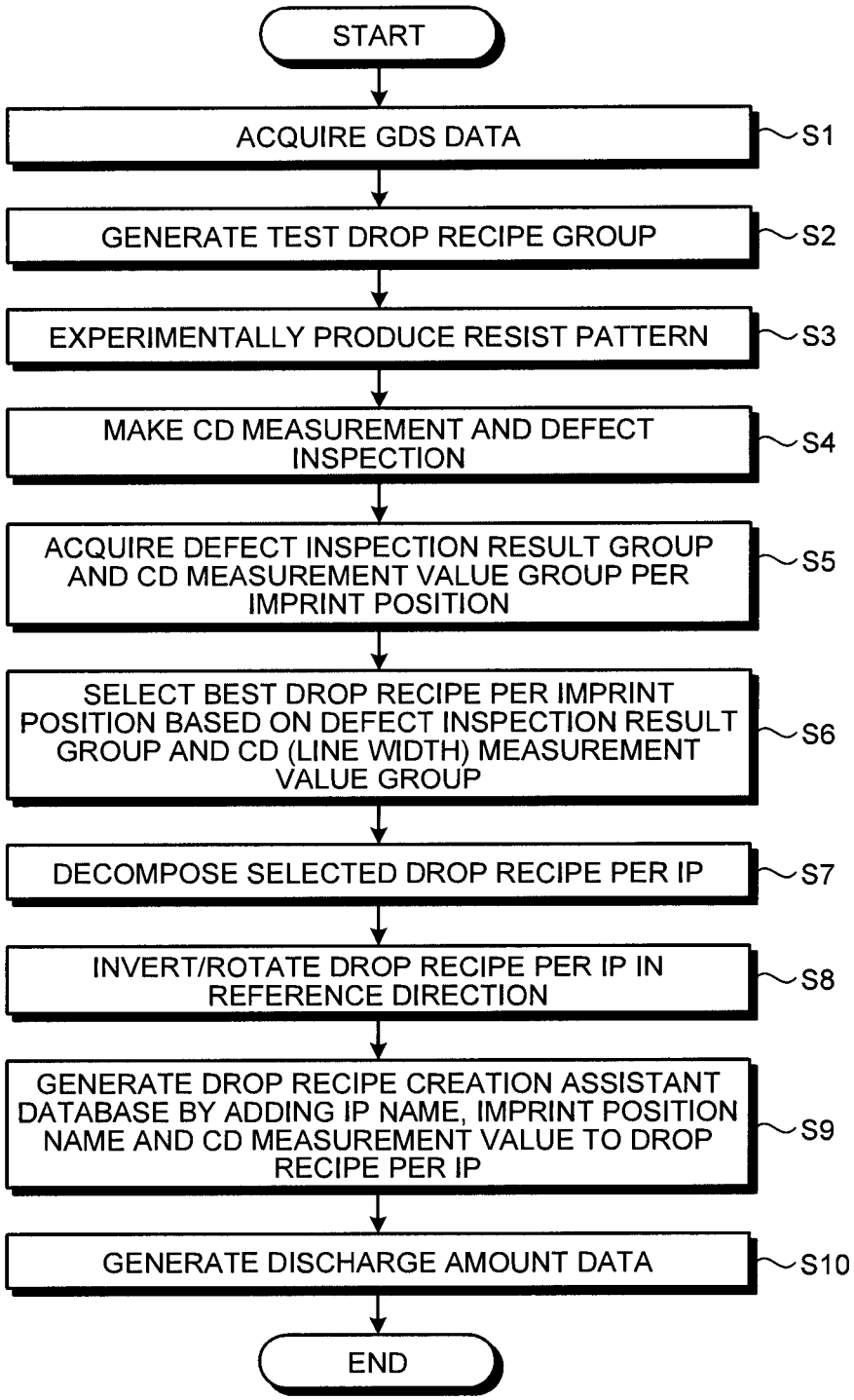
FIG. 8 is a flowchart for explaining a database creating method.

FIG. 8 is a flowchart for explaining the database creating method. As illustrated, the CPU 1 first acquires the GDS data 41 from the external storing device 4 (step S1). The CPU 1 interprets all the layers of the obtained GDS data 41 to generate the test drop recipe group 42 (step S2).

The user uses all the test drop recipes in the test drop recipe group 42 for all the imprint positions in the test drop recipe group 42 per imprint position to experimentally produce the resist patterns (step S3), and makes a CD measurement and a defect inspection on the experimentally-produced resist patterns (step S4). The user stores the obtained defect inspection result group 43 and CD measurement value group 44 in the external storing device 4.

The CPU 1 acquires the defect inspection result group 43 and the CD measurement value group 44 stored in the external storing device 4 (step S5), and selects a best drop recipe per imprint position from among the test drop recipe group based on the acquired defect inspection result group 43 and CD measurement value group 44 (step S6). The CPU 1 decomposes the selected drop recipe per IP (step S7). The CPU 1 either of or both inverts and rotates the drop recipe decomposed and acquired per IP in a predetermined reference direction (step S8). Thus, for the rotation, the drop recipes for the same IPs and mirror-symmetrical IPs can be managed as the drop recipe for one IP, causing the data size to be reduced.

The CPU 1 generates the drop recipe creation assistant database 45 with the IP name of the drop recipe per IP, the name of the imprint position and the representative line width of the template used for the experimental producing (step S9). The CPU 1 generates the discharge amount correction data 46 (step S10). Then, the database creating method ends.

In this way, according to the first embodiment of the present invention, since there is configured such that the test drop recipes (test drop recipe group 42) are created based on the design data (GDS data 41), a drop recipe with least defects is selected per imprint position from the test drop recipes based on the defect inspection results (defect inspection result group 43) of the resist patterns experimentally produced by use of the created test drop recipes, and the selected drop recipe is made to a database per IP to generate the drop recipe creation assistant database 45, when drop recipes for a new semiconductor integrated circuit are created, the resist recipe can be created by combining the drop recipes for the respective IPs configuring the new semiconductor integrated circuit based on the attribute information of the GDS data 41 on the new semiconductor integrated circuit so that the GDS data 41 for all the layers does not need to be read, thereby creating the drop recipes for the new semiconductor integrated circuit with ease and at a high speed. Since the drop recipe creation assistant database 45 holds the drop recipe per IP at each imprint position, the drop recipes for the new semiconductor integrated circuit can be created at the respective imprint positions. Since the drop recipe creation assistant database 45 holds the drop recipe per IP, although the one-shot imprinting is not possible at the imprint position Z, only the attribute information on the imprint-possible parts may be used to arrange the drop recipe per IP, thereby creating the drop recipe used for the imprint position Z with ease and at a high speed.

Figure 9:
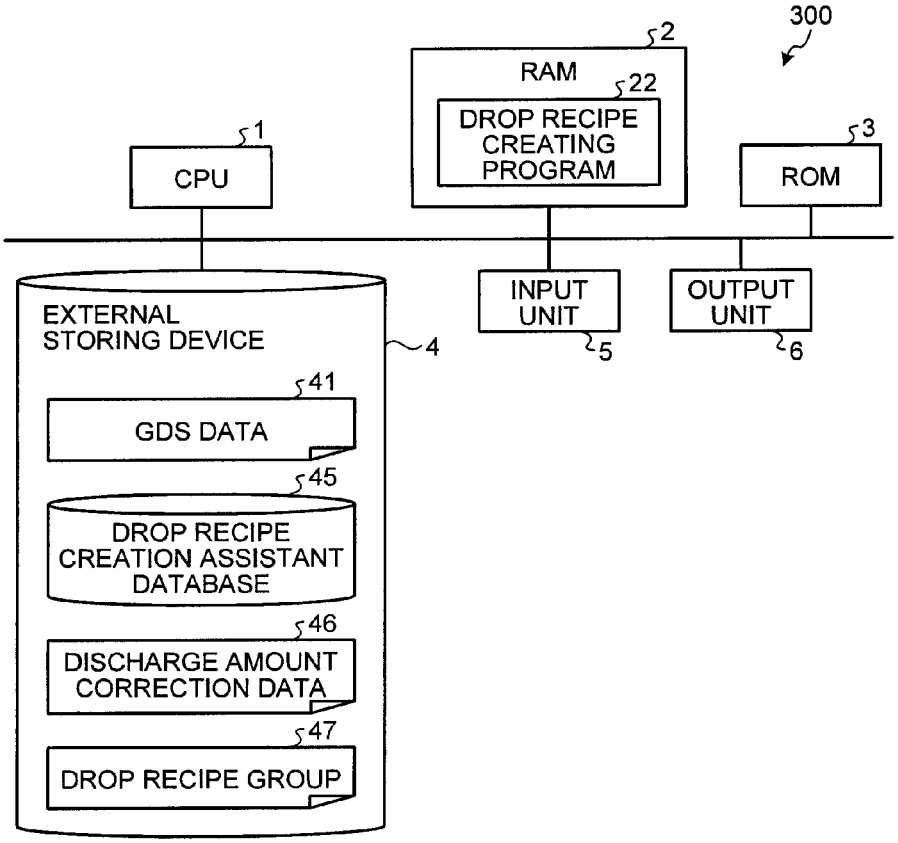
FIG. 9 is a diagram for explaining a structure of a drop recipe creating apparatus.

FIG. 9 is a diagram for explaining a structure of a drop recipe creating apparatus for creating drop recipes for a template of a new semiconductor integrated circuit by use of the drop recipe creation assistant database 45. As illustrated, a drop recipe creating apparatus 300 comprises a similar computer structure to the database creating apparatus 200, and is different therefrom in the contents stored in the external storing device 4 and the programs to be executed by the CPU 1.

The CPU 1 uses the drop recipe creation assistant database 45 to execute a drop recipe creating program 22 as computer program for creating a drop recipe (drop recipe group 47) per imprint position. The input unit 5 comprises a mouse and a keyboard, and is input the operations of the drop recipe creating apparatus 300 by the user. The operation information input into the input unit 5 is sent to the CPU 1.

The external storing device 4 is configured of a hard disk drive or the like, and is used as a data input/output device of the CPU 1. Specifically, the external storing device 4 previously stores therein the GDS data 41 on a semiconductor integrated circuit to be newly manufactured, the drop recipe creation assistant database 45 and the discharge amount correction data 46. The external storing device 4 stores therein the drop recipe group 47 created by the CPU 1.

The output unit 6 is a display device such as a liquid crystal monitor, and displays output information such as an operation screen for the operator based on the instructions from the CPU 1.

The drop recipe creating program 22 executed by the drop recipe creating apparatus 300 may be stored on a computer connected to the network such as the Internet and may be downloaded via the network to be provided or distributed. The drop recipe creating program 22 may be provided or distributed via the network such as the Internet. The drop recipe creating program 22 may be previously incorporated in the ROM 3 or the external storing device 4 to be provided to the drop recipe creating apparatus 300. The drop recipe creating program 22 may be recorded in a recording medium such as a CD-ROM to be provided or distributed.

Figure 10:
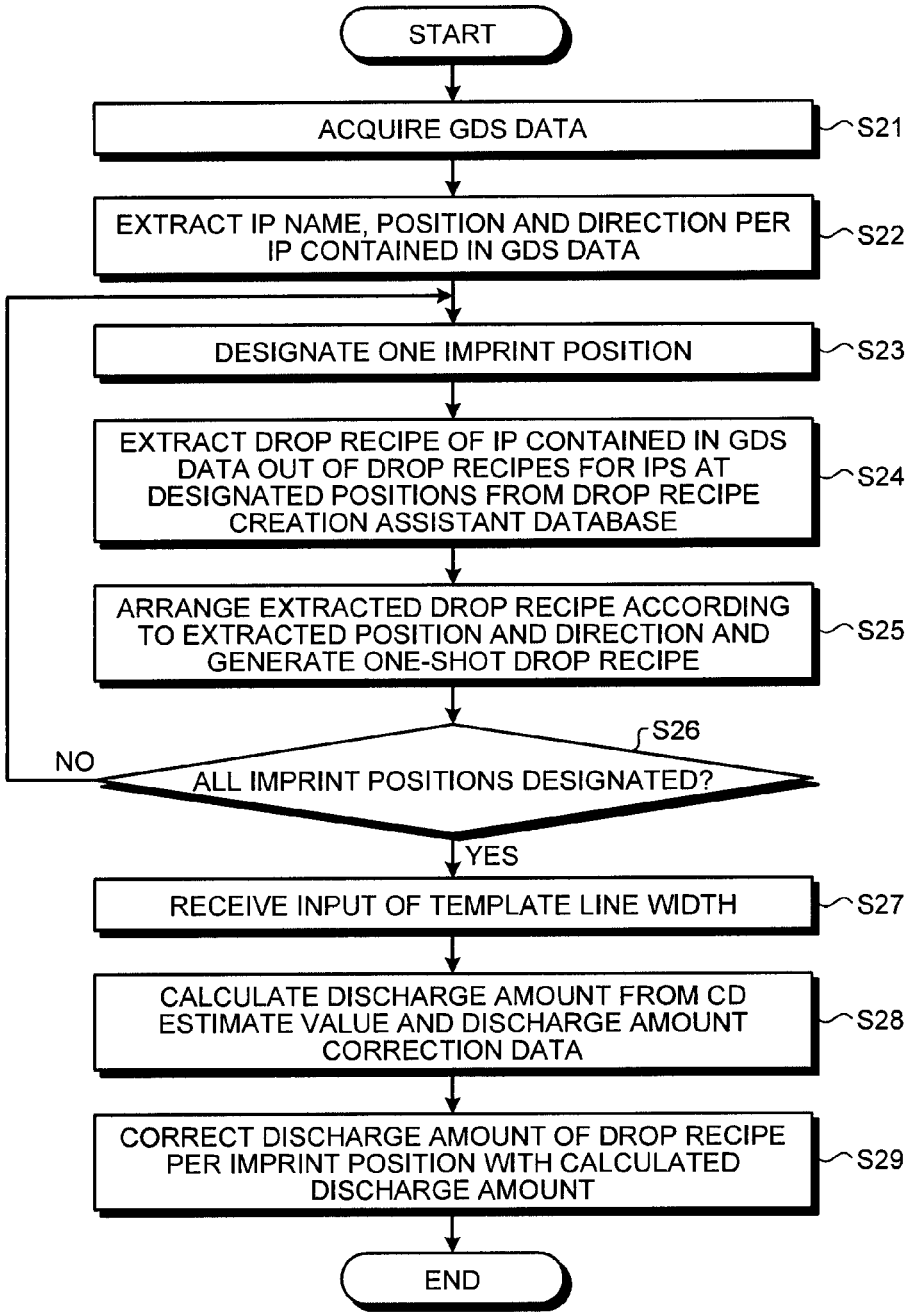
FIG. 10 is a flowchart for explaining a drop recipe creating method.

FIG. 10 is a flowchart for explaining a drop recipe creating method implemented by use of the drop recipe creating apparatus 300. As illustrated, the CPU 1 first acquires the GDS data 41 from the external storing device 4 (step S21). Then, the CPU 1 extracts the attribute information on IPs configuring a semiconductor integrated circuit to be manufactured from the layer 41-1 defining therein the attribute information contained in the GDS data 41 (step S22).

The CPU 1 designates one imprint position on the wafer 100 (step S23). The CPU 1 extracts a drop recipe for an IP configuring the semiconductor integrated circuit to be manufactured at the designated position from among the drop recipe creation assistant database 45 (step S24). Specifically, the CPU 1 searches for the drop recipe creation assistant database 45 with the IP name contained in the extracted attribute information and the designated imprint position as search keys, and then extracts a drop recipe.

The CPU 1 arranges the extracted drop recipe according to the arrangement position and the arrangement direction described in the attribute information, and completes the drop recipe for the one-shot at the designated imprint position (step S25).

The CPU 1 decides whether all the imprint positions have been designated (step S26). When undesignated imprint positions remain (in step S26, No), the CPU 1 proceeds to step S23 to designate one of the undesignated imprint positions. When all the imprint positions have been designated (in step S26, Yes), the CPU 1 is input the representative line width of the template used for manufacture (step S27). The representative line width is input from the input unit 5 by the user, for example. The CPU 1 uses the input representative line width to search for the discharge amount correction data 46, and calculates the discharge amount corresponding to the representative line width (step S28). The CPU 1 corrects the discharge amount of the drop recipe per imprint position by the calculated discharge amount (step S29) so that the drop recipe per imprint position (drop recipe group 47) is completed.

In this way, according to the second embodiment of the present invention, since there is configured such that the arrangement positions of the IPs configuring the semiconductor integrated circuit are extracted from the GDS data 41, the drop recipes of the IPs configuring the semiconductor integrated circuit at desired imprint positions are extracted from the drop recipe creation assistant database 45, and the extracted drop recipes are arranged based on the extracted corresponding arrangement position to generate the drop recipes for the template of the semiconductor integrated circuit, all the layers configuring the GDS data 41 do not need to be read each time the drop recipe is created, thereby creating the drop recipes with ease and at a high speed.

Since the discharge amount of the hardening resin material is corrected in the drop recipes for the template based on the representative line width of the template of the semiconductor integrated circuit, the imprinting can be performed without creating the drop recipe per individual template.

The features of the resist material, which influence the number of defects, include contraction rate, elastic force, base material adhesion force, charging property, solvent resistance, fluorine content rate, and the like. The features have a relationship in which one feature is enhanced while other feature deteriorates, and thus a most desirable composition is not possible for all the features. Thus, the imprinting is typically performed by use of one kind of resist material whose composition is adjusted such that the number of defects in an one-shot is as small as possible.

In recent years, there has been developed an applying apparatus for dropping multiple kinds of resist materials in one template. When the applying apparatus is used, an optimum resist material can be selected and locally applied. When the test drop recipe group 42 is created in the first embodiment (step S2), the resist patterns for which different resist materials are designated, respectively, may be created.

In this way, the drop recipe creation assistant database 45 is configured by the drop recipes optimized by the resist materials so that the drop recipes by which the resist material is locally changed can be created with ease and at a high speed.

For example, it is highly likely that the IPs such as memory cells containing many lines and spaces are charged due to friction during separation and the lines fall down due to the charges, causing defects. The resist material whose composition is not easily charged can be used for the IPs in contrast to other IPs.

As described above, according to the third embodiment of the present invention, when the drop recipe is defined based on the GDS data while multiple anisotropic patterns are remarkably deflected and arranged like the lines and patterns, the resist material flows out in a specific direction when the template is pressed, and thus the resist material does not spread over the entire template as intended, which may consequently cause an increase in defects.

Figure 11:
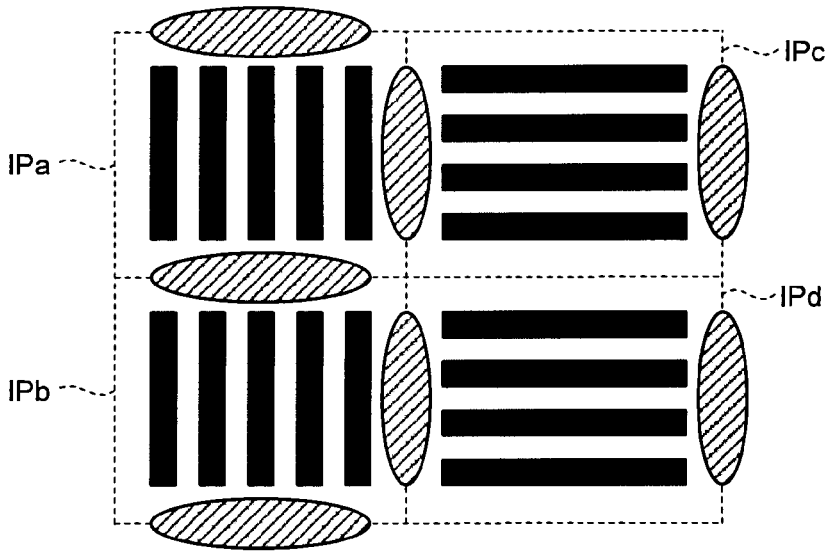
FIG. 11 is a diagram illustrating one exemplary template pattern in which a resist material flows in a specific direction.

For example, the template pattern illustrated in FIG. 11 is an exemplary template pattern in which the resist material flows out in a specific direction. The black rectangles indicate the formed resist patterns. The template pattern includes four IPs including IPa, IPb, IPc and IPd each comprising the lines and patterns. When the lines and patterns are pressed, the resist material easily flows along the lines. Thus, the resist material tends to flow into the hatched areas in FIG. 11.

In order to prevent the resist material from flowing in the specific direction, the drop recipe per IP configuring the drop recipe creation assistant database may be created such that the highly-viscous resist material is arranged in the direction in which the resist material easily flows.

Figure 12:
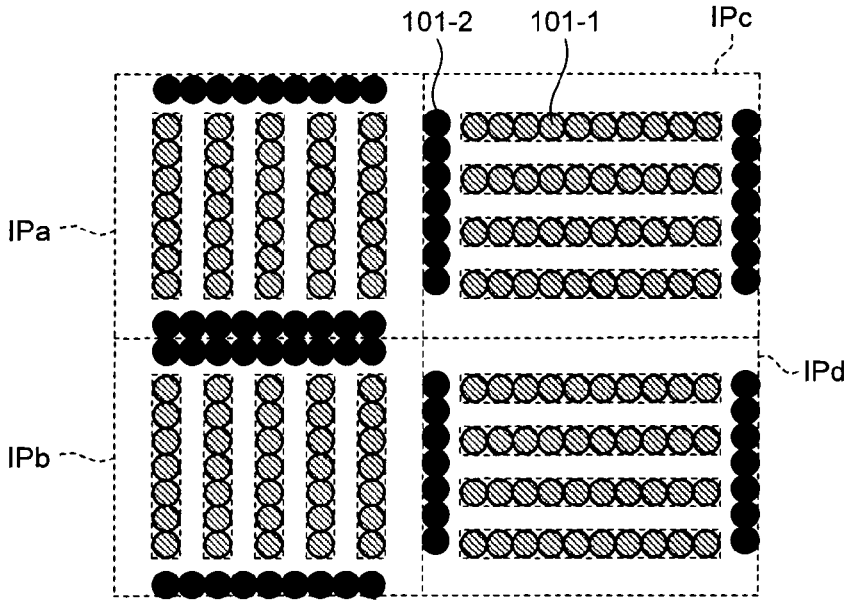
FIG. 12 is a diagram for explaining exemplary drop recipes for respective IPs configuring the drop recipe creation assistant database.

FIG. 12 is a diagram for explaining exemplary drop recipes for IPs configuring the drop recipe creation assistant database. As illustrated, in the drop recipe per IP (IPa to IPd), a resist material 101-1, which is selected for reducing the number of defects, is applied to the lines. A resist materials 101-2 with a higher viscosity than the resist material 101-1 is applied at the ends of the lines in line. Thus, even when the resist material 101-1 flows out in the line direction, the flow is blocked by the barriers formed by the resist material 101-2, thereby preventing the resist material 101-1 from flowing out in the specific direction. There is described in the figure that the resist material 101-2 is applied at the ends of the lines in line, but the drop recipe may be created such that the resist material 101-2 is applied along all the sides to surround the pattern per IP.

In this way, according to the fourth embodiment of the present invention, the test drop recipe is such that a resist material with a higher viscosity than the resist material is arranged at the positions where the resist material is prevented from flowing during the imprinting per IP configuring a semiconductor integrated circuit, thereby preventing the resist material from flowing in the specific direction per IP.

There has been described in the first to fourth embodiments that the drop recipe creation assistant database 45 is configured by the drop recipes for the respective IPs, but any circuit block in any tier whose attribute information is defined in the GDS data 41 may be used as unit of the drop recipe held by the drop recipe creation assistant database 45.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A drop recipe creating method comprising:

storing, by a memory, a database holding first drop recipes for respective functional circuit blocks at respective imprint positions;

extracting, by a processor, arrangement positions of a plurality of functional circuit blocks configuring a semiconductor integrated circuit on the semiconductor integrated circuit from design data of the semiconductor integrated circuit stored in the memory;

extracting, by the processor, the first drop recipes for each of the functional circuit blocks configuring the semiconductor integrated circuit at designated imprint positions from the database;

creating, by the processor, a second drop recipe of the semiconductor integrated circuit by arranging the extracted first drop recipes based on the extracted corresponding arrangement positions and combining the arranged first drop recipes; and outputting, by the processor, the second drop recipe to the memory.

2. The drop recipe creating method according to claim 1, comprising:

extracting, by the processor, arrangement directions of the functional circuit blocks configuring the semiconductor integrated circuit from the design data; and when creating the second drop recipe, arranging, by the processor, the extracted first drop recipes of the functional circuit blocks based on the extracted arrangement positions and arrangement directions.

3. The drop recipe creating method according to claim 1, further comprising correcting, by the processor, the discharge amount of a hardening resin material in the second drop recipe based on a representative line width of the semiconductor integrated circuit.

*4. A drop recipe creating method used in transferring a pattern to a semiconductor wafer, wherein a drop recipe defines one or more application amount distributions of one or more resist materials on a semiconductor wafer, the method comprising:*

*storing, in a memory, a database of first drop recipes, wherein the first drop recipes are each associated with one or more first patterns and with one or more imprint positions;*

*extracting, by a processor, arrangement positions on the semiconductor wafer of second patterns, the second patterns configuring patterns to be formed on the semiconductor wafer;*

*extracting from the database, by the processor, at least two of the first drop recipes for at least two of the second patterns at designated imprint positions on the semiconductor wafer;*

*arranging, by the processor, the extracted first drop recipes on the semiconductor wafer based on the extracted arrangement positions;*

*creating, by the processor, a second drop recipe based on the arranged first drop recipes; and*

*outputting, by the processor, the second drop recipe to the memory.*

*5. The drop recipe creating method according to claim 4, further comprising:*

*extracting, by the processor, arrangement directions of the second patterns based on the design data;*

*wherein the extracted first drop recipes are also arranged based on the extracted arrangement directions.*

*6. The drop recipe creating method according to claim 4, further comprising:*

*determining, by the processor, one or more discharge amounts of the one or more resist materials based on a representative pattern width of the patterns to be formed on the semiconductor wafer.*

*7. The drop recipe creating method according to claim 4, wherein the one or more application distribution amounts defined by the first drop recipes are related to at least one of a defect inspection result and a critical dimension measurement result of resist patterns created using a set of drop recipes including the first drop recipes.*

*8. The drop recipe creating method according to claim 4, wherein the one or more application distribution amounts defined by at least one of the first drop recipes are related to one or more features of the resist materials.*

*9. The drop recipe creating method according to claim 8, wherein the one or more features include at least one of contraction rate, elastic force, base material adhesion force, charging property, solvent resistance, and fluorine content rate.*

*10. The drop recipe creating method according to claim 4, wherein the one or more application distribution amounts defined by at least one of the first drop recipes are related to a flowing direction of at least one of the resist materials in the associated first patterns.*

*11. The drop recipe creating method according to claim 4, wherein at least some of the first patterns are associated with one or more circuit blocks.*

*12. The drop recipe creating method according to claim 11, wherein the one or more circuit blocks include at least one functional circuit block.*

*13. The drop recipe creating method according to claim 11, wherein the one or more circuit blocks include at least one test circuit block.*

*14. The drop recipe creating method according to claim 11, wherein the one or more circuit blocks include at least one peripheral circuit block.*

*15. The drop recipe creation method according to claim 4, wherein at least one of the first patterns includes one or more cell patterns.*

*16. The drop recipe creation method according to claim 4, wherein at least one of the first patterns includes one or more lines.*

*17. The drop recipe creation method according to claim 4, wherein one of the first recipes is associated with one of the first patterns to be formed on a first shot area of the semiconductor wafer and one of the first recipes is associated with one of the first patterns to be formed on a second shot area of the semiconductor wafer, wherein the first shot area of the semiconductor wafer does not include a periphery of the semiconductor wafer and the second shot area of the semiconductor wafer includes the periphery of the semiconductor wafer.*

*18. The drop recipe creation method according to claim 17, wherein both of the first patterns to be formed on the first and the second shot areas of the semiconductor wafer include cell patterns.*

*19. The drop recipe creation method according to claim 4, wherein the extracted first drop recipes are respectively associated with the first patterns in the database corresponding to the second patterns of which arrangement positions are extracted.*

*20. A non-transitory computer readable medium comprising instructions that, when executed by a computer, cause the computer to perform a method of creating a drop recipe that defines one or more application distribution amounts of one or more resist materials on a semiconductor wafer, the method being used in transferring a pattern to a semiconductor wafer and comprising:*

*storing, in a memory, a database including first drop recipes, wherein the first drop recipes are associated with one or more first patterns and with one or more imprint positions;*

*extracting arrangement positions on the semiconductor wafer of second patterns, the second patterns configuring patterns to be formed on the semiconductor wafer;*

*extracting from the database at least two of the first drop recipes for at least two of the second patterns at designated imprint positions;*

*arranging the extracted first drop recipes based on the extracted arrangement positions;*

*creating a second drop recipe based on the arranged first drop recipes; and*

*outputting the second drop recipe to the memory.*

*21. The medium according to claim 20, wherein the method further comprises:*

*extracting arrangement directions of the second patterns based on the design data;*

*wherein the extracted first drop recipes are also arranged based on the extracted arrangement directions.*

*22. The medium according to claim 20, wherein the method further comprises:*

*determining one or more discharge amounts of the resist materials based on a representative pattern width of the patterns to be formed on the semiconductor wafer.*

*23. The medium according to claim 20, wherein the one or more application amount distributions defined by the first drop recipes are related to at least one of a defect inspection result and a critical dimension measurement result of resist patterns created using a set of drop recipes including the first drop recipes.*

*24. The medium according to claim 20, wherein the one or more application amount distributions defined by at least one of the first drop recipes are related to one or more features of the resist materials.*

*25. The medium according to claim 24, wherein the one or more features include at least one of contraction rate, elastic force, base material adhesion force, charging property, solvent resistance, and fluorine content rate.*

*26. The medium according to claim 20, wherein the one or more application amount distributions defined by at least one of the first drop recipes are related to a flowing direction of at least one of the resist materials in the associated first patterns.*

*27. The medium according to claim 20, wherein at least some of the first patterns are associated with one or more circuit blocks.*

*28. The medium according to claim 27, wherein the one or more circuit blocks include at least one functional circuit block.*

*29. The medium according to claim 27, wherein the one or more circuit blocks include at least one test circuit block.*

*30. The medium according to claim 27, wherein the one or more circuit blocks include at least one peripheral circuit block.*

*31. The medium according to claim 20, wherein at least one of the first patterns includes one or more cell patterns.*

*32. The medium according to claim 20, wherein at least one of the first patterns includes one or more lines.*

*33. The medium according to claim 20, wherein one of the first recipes is associated with one of the first patterns to be formed on a first shot area of the semiconductor wafer and one of the first recipes is associated with one of the first patterns to be formed on a second shot area of the semiconductor wafer, wherein the first shot area of the semiconductor wafer does not include a periphery of the semiconductor wafer and the second shot area of the semiconductor wafer includes the periphery of the semiconductor wafer.*

*34. The medium according to claim 33, wherein both of the first patterns to be formed on the first and the second shot areas of the semiconductor wafer include cell patterns.*

*35. The medium according to claim 20, wherein the extracted first drop recipes are respectively associated with the first patterns in the database corresponding to the second patterns of which arrangement positions are extracted.*

* * * * *